United States Patent
Grillberger et al.

(10) Patent No.: US 8,482,123 B2
(45) Date of Patent: Jul. 9, 2013

(54) STRESS REDUCTION IN CHIP PACKAGING BY USING A LOW-TEMPERATURE CHIP-PACKAGE CONNECTION REGIME

(75) Inventors: Michael Grillberger, Radebeul (DE); Matthias Lehr, Dresden (DE); Thomas Werner, Moritzburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 24 days.

(21) Appl. No.: 13/179,643

(22) Filed: Jul. 11, 2011

(65) Prior Publication Data
US 2012/0049350 A1    Mar. 1, 2012

(30) Foreign Application Priority Data
Aug. 31, 2010  (DE) .................. 10 2010 040 065

(51) Int. Cl.
*H01L 23/48* (2006.01)
(52) U.S. Cl.
USPC .......................................... 257/737; 438/106
(58) Field of Classification Search
USPC .............. 257/737, E23.01, E21.499; 438/106
See application file for complete search history.

(56) References Cited

U.S. PATENT DOCUMENTS

| | | | |
|---|---|---|---|
| 4,912,545 A * | 3/1990 | Go ................................ | 257/737 |
| 5,411,400 A * | 5/1995 | Subrahmanyan et al. ...... | 439/68 |
| 5,903,059 A | 5/1999 | Bertin et al. | |
| 6,137,184 A | 10/2000 | Ikegami | |
| 6,392,144 B1 * | 5/2002 | Filter et al. ..................... | 174/535 |
| 6,562,637 B1 * | 5/2003 | Akram et al. ................... | 438/14 |
| 7,095,116 B1 * | 8/2006 | Kelkar et al. ................. | 257/737 |
| 7,964,964 B2 * | 6/2011 | Sheats ........................... | 257/737 |
| 2005/0230825 A1 * | 10/2005 | Akram et al. ................. | 257/737 |
| 2006/0220230 A1 | 10/2006 | Tanaka et al. | |
| 2007/0102816 A1 | 5/2007 | Kim | |
| 2009/0218684 A1 * | 9/2009 | Pavier et al. .................. | 257/737 |
| 2010/0327440 A1 * | 12/2010 | Pozder et al. ................. | 257/737 |

OTHER PUBLICATIONS

Translation of Official Communication from German Patent Application No. 10 2010 040 065.3 dated May 23, 2011.

* cited by examiner

*Primary Examiner* — Thao P. Lee
(74) *Attorney, Agent, or Firm* — Williams, Morgan & Amerson, P.C.

(57) ABSTRACT

A semiconductor chip and a package substrate may be directly connected on the basis of form closure by providing appropriately shaped complementary contact structures in the semiconductor chip and the package substrate. Consequently, solder material may no longer be required and thus any elevated temperatures during the assembly process may be avoided, which may conventionally result in significant stress forces, thereby creating damage, in particular in very complex metallization systems.

23 Claims, 7 Drawing Sheets

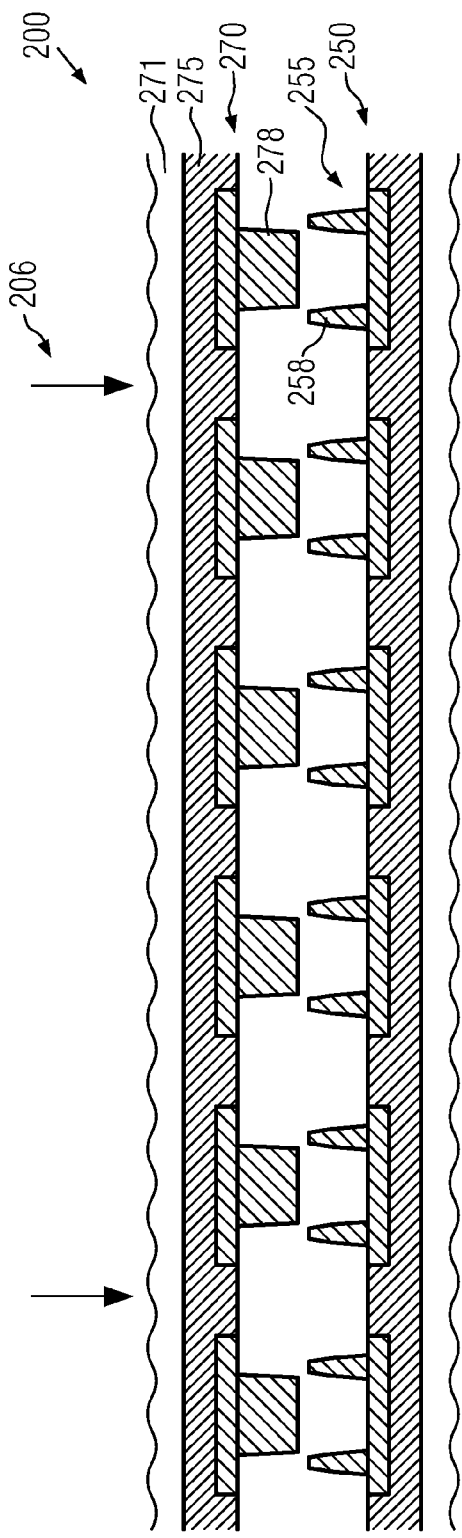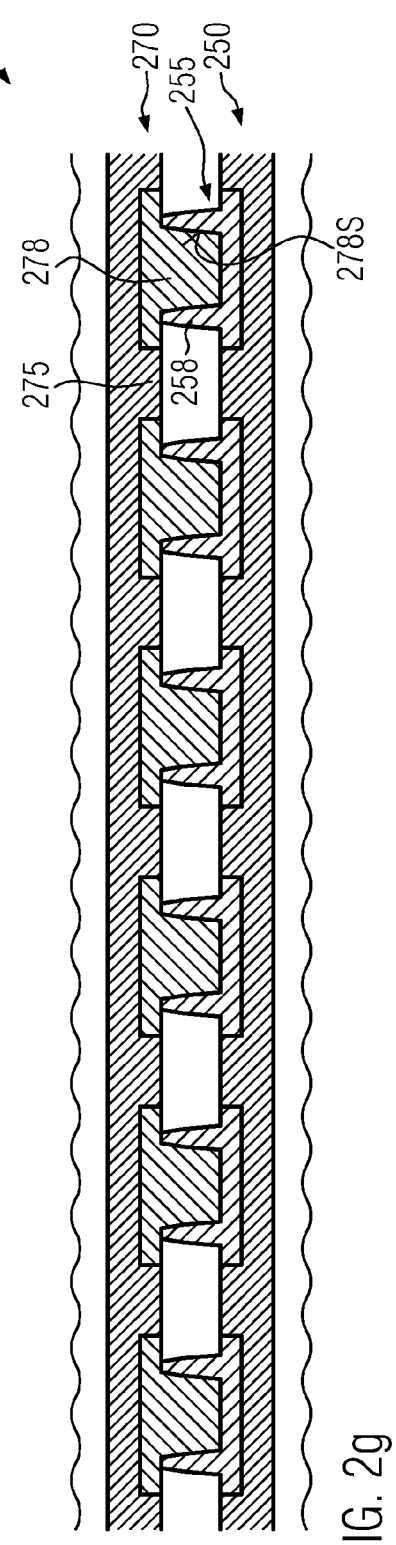

STRESS REDUCTION IN CHIP PACKAGING BY USING A LOW-TEMPERATURE CHIP-PACKAGE CONNECTION REGIME

BACKGROUND OF THE INVENTION

1. Field of the Invention

Generally, the present disclosure relates to integrated circuits, and, more particularly, to the techniques for reducing chip-package interactions caused by thermal mismatch between the chip and the package substrate.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable base materials for forming semiconductor devices, such as microprocessors, SRAMs, ASICs (application specific ICs), systems on chip (SoC) and the like. The individual integrated circuits are arranged in an array on the wafer, wherein most of the manufacturing steps, which may involve several hundred and more individual process steps in sophisticated integrated circuits, are performed simultaneously for all chip areas on the substrate, except for photolithography processes, metrology processes and packaging of the individual devices after dicing the semiconductor substrate. Thus, economic constraints drive semiconductor manufacturers to steadily increase the substrate dimensions, thereby also increasing the area available for producing actual semiconductor devices and thus increasing production yield.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the feature sizes of circuit elements are steadily scaled down. Due to this ongoing demand for shrinking the feature sizes of highly sophisticated semiconductor devices, copper, in combination with low-k dielectric materials, has become a frequently used alternative in the formation of so-called metallization systems comprising metal line layers and intermediate via layers that include metal lines as intra-layer connections and vias as inter-layer connections, which commonly connect individual circuit elements to provide the required functionality of the integrated circuit. Typically, a plurality of metal line layers and via layers stacked on top of each other is necessary to realize the connections between all internal circuit elements and I/O (input/output), power and ground pads of the circuit design under consideration.

For extremely scaled integrated circuits, the signal propagation delay is no longer limited by the circuit elements, such as field effect transistors and the like, but is limited, owing to the increased density of circuit elements requiring an even more increased number of electrical connections, by the close proximity of the metal lines, since the line-to-line capacitance is increased and the conductivity of the lines is reduced due to a reduced cross-sectional area. For this reason, traditional dielectrics, such as silicon dioxide (k>3.6) and silicon nitride (k>5), are replaced by dielectric materials having a lower permittivity, which are, therefore, also referred to as low-k dielectrics, having a relative permittivity of 3.0 or less. However, the density and mechanical stability or strength of the low-k materials may be significantly less compared to the well-approved dielectrics silicon dioxide and silicon nitride. As a consequence, during the formation of the metallization system and any subsequent manufacturing processes of integrated circuits, production yield may depend on the mechanical characteristics of sensitive dielectric materials, such as low-k dielectric layers, and their adhesion to other materials.

In addition to the problems of reduced mechanical stabilities of advanced dielectric materials having a dielectric constant of 3.0 and significantly less, device reliability may also be affected by these materials during operation of sophisticated semiconductor devices due to an interaction between the chip and the package, wherein this interaction is caused by a thermal mismatch of the corresponding thermal expansion of the different materials. For instance, in the fabrication of complex integrated circuits, increasingly, a contact technology may be used for connecting the package substrate to the chip, which is known as flip chip packaging technique. Contrary to the well-established wire bonding techniques in which appropriate contact pads may be positioned at the periphery of the very last metal layer of the chip, which may be connected to corresponding terminals of the package by a wire, in the flip chip technology, a respective bump or pillar structure may be formed on the last metallization layer, for instance comprised of a solder material, which may be brought into contact with respective contact pads of the package. Thus, after reflowing the bump material, a reliable electrical and mechanical connection may be established between the last metallization layer of the chip and the contact pads of the package substrate. In this manner, a very large number of electrical connections may be provided across the entire chip area of the last metallization layer with reduced contact resistance and parasitic capacitance, thereby providing the IO (input/output) capabilities as required for complex integrated circuits, such as CPUs, storage memories and the like. During the corresponding process sequence for connecting the bump structure with a package substrate, a certain degree of pressure and heat is applied to the composite device so as to establish a reliable connection between each of the bumps formed on the chip and the bumps or pads that may be provided on the package substrate. The thermally or mechanically induced stress may, however, also act on the lower-lying metallization layers, which may typically include low-k dielectrics or even ultra low-k (ULK) dielectric materials, thereby significantly increasing the probability of creating defects by delamination of these sensitive materials due to reduced mechanical stability and adhesion to other materials.

Moreover, during operation of the composite semiconductor device, i.e., the semiconductor chip attached to the corresponding package substrate, significant mechanical stress may also occur due to a significant mismatch in the thermal expansion behavior of the silicon-based semiconductor chip and the package substrate, since, in volume production of sophisticated integrated circuits, economic constraints typically require the use of specified substrate materials for the package, such as organic materials, which may typically exhibit a different thermal conductivity and a different coefficient of thermal expansion compared to the silicon chip. Consequently, a premature failure of the metallization system may occur.

With reference to FIGS. 1a-1b, a typical chip-package interaction will be described in more detail.

FIG. 1a schematically illustrates a cross-sectional view of an integrated circuit 100 comprising a semiconductor die or chip 150 connected to a package substrate 170, which is substantially comprised of an organic material, such as a polymer material and the like. As discussed above, in total, the semiconductor chip 150 has a coefficient of thermal expansion (CET) that is significantly different from the CET of the package substrate 107, that is, typically the CET of the package substrate 170 may be greater compared to the silicon-based semiconductor die 150. The semiconductor die 150 typically comprises a substrate 151, for instance in the form of a silicon substrate or an SOI substrate, depending on the overall configuration of the circuit layout and performance of the integrated circuit 100. Moreover, a silicon-based semiconductor layer 152 is provided "above" the substrate 151, wherein the semiconductor layer 152 comprises a very large number of circuit elements, such as transistors, capacitors, resistors and the like, as are required for implementing the desired functionality of the integrated circuit 100. As previously discussed, the ongoing shrinkage of critical dimensions of circuit elements has resulted in critical dimensions of transistors on the order of magnitude of 50 nm and significantly less in presently available sophisticated semiconductor devices that are produced by volume production techniques.

The semiconductor chip 150 further comprises a metallization system 153, which, in advanced semiconductor devices, comprises a plurality of metallization layers, i.e., device levels in which metal lines and vias are embedded in an appropriate dielectric material. As explained above, at least a portion of the corresponding dielectric materials used in the various metallization layers of the metallization system 153 are comprised of materials of reduced mechanical stability in order to provide as low a parasitic capacitance of adjacent metal lines as possible. Moreover, the device 150 comprises a bump structure 155 that is appropriately connected to the metallization system 153, wherein the corresponding bumps or metal pillars may be provided as a part of the last metallization layer of the system 153, for instance in the form of a solder material, metal pillars, or a combination thereof. On the other hand, the package substrate 170 comprises appropriately positioned and dimensioned contact pads of a contact structure 175, which may be brought into contact with the corresponding bumps of the structure 155 in order to establish respective mechanical and electrical connections upon applying heat and mechanical pressure. Furthermore, the package substrate 170 may comprise any appropriate conductive lines (not shown) in order to connect the bump structure 155 with appropriate terminals, which thus establish an electrical interface to other peripheral components, such as a printed wiring board and the like.

In particular during the process of forming the composite device 100 from the semiconductor die 150 and the package substrate 170, heat is generated in the semiconductor chip 150 or is transferred thereto, which may finally result in a significant interaction between the semiconductor die 150 and the package substrate 170, for instance after reflowing and hardening of the bumps in the structure 155, which may thus result in significant shear forces due to the mismatch in the CETs of the devices 150 and 170. For example, at the interface between the semiconductor die 150 and the package substrate 170, that is, in particular, the bump structure 155 and the metallization system 153, may experience significant mechanical stress forces caused by the thermal mismatch during assembly and operation of the device 100. Due to the reduced mechanical stability and the reduced adhesion of sophisticated dielectric materials, corresponding defects typically occur, which thus affect the overall reliability and also production yield when operating or manufacturing the integrated circuit 100. For example, a certain degree of thermally induced stress, as indicated by 103, may occur in the package substrate 170, thereby resulting in a certain degree of bending or bowing, indicated by 176, due to any temperature gradients and the increased CET of the material 170 compared to the semiconductor die 150.

FIG. 1b schematically illustrates an enlarged view of a portion of the metallization system 153 during a typical situation when operating the integrated circuit 100 (FIG. 1a) or when assembling the device in a final phase, when the solder bumps increasingly harden after reflowing of any solder material. As illustrated, the metallization system 153 comprises the plurality of metallization layers, wherein, for convenience, two metallization layers 154 and 156 are illustrated. For example, the metallization layer 156 comprises a dielectric material 156A, in which corresponding metal lines 156B and vias 156C are embedded. Similarly, the metallization layer 154 comprises a dielectric material 154A and respective metal lines 154B and vias 154C. As previously explained, at least some of the metallization layers in the metallization system 153 comprise a sensitive dielectric material in the form of a low-k dielectric material or a ULK material, which exhibits a significantly reduced mechanical stability compared to other dielectrics, such as silicon nitride, silicon carbide, nitrogen-containing silicon carbide, which may frequently be used as etch stop or capping layers provided between the individual metallization layers 154, 156. Consequently, during operation or assembly of the integrated circuit 100, due to the different behavior with respect to thermal expansion, a significant mechanical stress is transferred into the metallization layers 156, 154, as indicated by 103. The stress 103 is also present in the package substrate 170 (FIG. 1a) and may result in a material deformation, as indicated by 176 in FIG. 1a. On the other hand, the mechanical stress 103 in the metallization system 153 may induce a more or less pronounced strained state that results in the creation of certain defects 154D, 156D, which in turn may finally result in a certain degree of delamination, since typically the adhesion and mechanical stability of ULK dielectric materials is reduced compared to conventional dielectric materials, as discussed above. Consequently, the resulting delamination may finally result in a premature failure of the metallization system 153 or in an initial failure of the metallization system, thereby contributing to reduced production yield and reduced overall reliability of the integrated circuit 100 (FIG. 1a).

The problem of reduced reliability and reduced production yield of sophisticated metallization systems is even further exacerbated in advanced process technologies in which the dielectric constant of the low-k dielectric materials is to be further reduced, while at the same time the dimensions of the corresponding chip areas are increased in order to even further incorporate more and more functions into the integrated circuits. On the other hand, the increased complexity of the overall circuit layout may also require an increased number of stacked metallization layers, as previously explained, which may additionally result in a reduced overall mechanical stability of the metallization system. Furthermore, the usage of lead-free materials in the bump structure 155 (FIG. 1a) may result in an increased mechanical coupling of the package substrate 170 and the semiconductor chip 150, thereby resulting in even higher mechanical stress, since typically lead-free contact assemblies are less resilient compared to lead-containing solder materials.

For these reasons, in conventional approaches, the overall size of the semiconductor die has to be restricted to appropriate dimensions in performance-driven metallization systems so as to maintain the overall mechanical stress components at an acceptable level. In other cases, the number of metallization layers may be restricted, thereby also reducing the packing density and/or complexity of the circuit layout. In still other conventional approaches, less sophisticated dielectric materials are used in order to enhance the overall mechanical stability, thereby, however, sacrificing performance of the integrated circuits.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which yield losses and reduced reliability of packaged semiconductor devices may be reduced by avoiding a solder process when directly attaching a package substrate to a semiconductor chip. By avoiding the solder process, in particular in lead-free device configurations, the associated high solder temperatures may be avoided, thereby also eliminating any thermally induced mechanical stresses caused by the mismatch in the coefficient in thermal expansion between the package substrate and the semiconductor chip. To this end, the electrical connections between the contact structure of the package substrate and the contact structure of the semiconductor chip may be established on the basis of mechanical interaction without requiring specific solder materials at any interfaces formed between contact elements of the package substrate and contact elements of the semiconductor chip. That is, the connection between the complementary contact elements of the package and the semiconductor chip may be established on the basis of form closure of at least the correspondingly configured contact elements, thereby providing for mechanical attachment and also a reliable electrical and thermal connection between the metal-containing contact elements. For example, a socket and plug-like contact regime may be established in the package substrate and in the semiconductor chip, wherein at least a portion of each contact element in one of the semiconductor chip and the package substrate may be engaged with at least a portion of a corresponding contact element of the other one of the package substrate and the semiconductor chip. In this manner, an interface may be formed between the complementary contact elements wherein the sticking friction may provide superior mechanical stability, while generally the increased contact area provided by the interface may also result in an efficient electrical and thermal connection. Since, in some illustrative embodiments disclosed herein, the mechanical attachment of the package substrate to the semiconductor chip may be established on the basis of mechanical forces acting substantially perpendicularly on the sensitive metallization system, significant shear forces and thus mechanical stresses may be avoided in the metallization system, thereby reducing the probability of creating damage during the mechanical process of connecting the package and the semiconductor chip. Furthermore, since substantially the same mechanical forces may act on each surface area of the package and the semiconductor chip, a pronounced bending may be avoided during the attachment, a non-uniform distribution of mechanical forces, as may typically be encountered in conventional solder regimes, may be avoided. Consequently, the present disclosure provides superior flexibility in selecting appropriate metal materials, since specifically designed materials may no longer be required. Thus, lead-free contact regimes on the basis of materials such as aluminum, copper, silver, gold and the like, or any combinations thereof, may be efficiently implemented and may be adapted to process requirements, for instance with respect to material resources and equipment, as may be used during the formation of a complex metallization system of the semiconductor chip. Moreover, any appropriate temperature may be selected for performing the process of attaching the package and the semiconductor chip, thereby achieving superior flexibility in controlling the overall process conditions and thus the resulting mechanical forces created in the metallization system. For example, a temperature may be used that is within the usual storage temperature of the semiconductor chip and its average or rated operating temperature so that any thermally induced mechanical forces may be less than thermally induced stresses caused during the normal operation of the semiconductor device. In this case, the mechanical characteristics and thus the electrical performance of complex metallization systems may be adjusted with respect to obtaining superior performance of the entire semiconductor device, without requiring taking into consideration additional thermally induced stress forces that are typically induced in conventional solder processes.

One illustrative semiconductor device disclosed herein comprises a semiconductor chip comprising a metallization system, which in turn comprises a chip contact structure that comprises a chip contact element. The semiconductor device further comprises a package substrate comprising a package contact structure, which in turn comprises a package contact element, wherein the chip contact element and the package contact element are mechanically engaged with each other and form an interface.

A further illustrative semiconductor device disclosed herein comprises a package substrate comprising a package contact element. Furthermore, the semiconductor device comprises a semiconductor chip connected to the package substrate and comprising a chip contact element that is attached to the package contact element by form closure.

One illustrative method disclosed herein relates to forming a packaged semiconductor device. The method comprises forming a chip contact structure above a substrate of a semiconductor chip and forming a package contact structure above a package substrate. Furthermore, the method comprises attaching the package substrate to the semiconductor chip by form closure of at least a portion of the chip contact structure and the package contact structure.

BRIEF DESCRIPTION OF THE DRAWINGS

The disclosure may be understood by reference to the following description taken in conjunction with the accompanying drawings, in which like reference numerals identify like elements, and in which:

FIGS. 2f and 2g schematically illustrate cross-sectional views of a package substrate and a semiconductor chip during a mechanical assembly process at moderately low temperatures, according to illustrative embodiments;

Figure 1A:
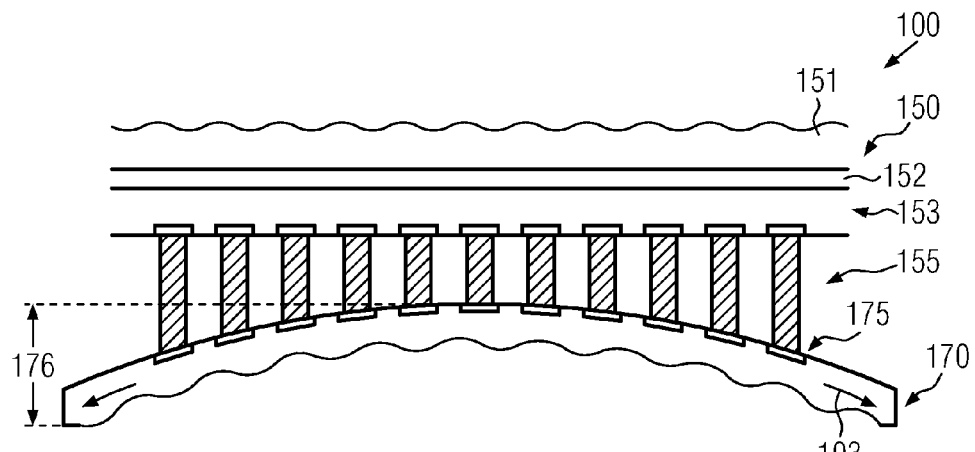
FIG. 1a schematically illustrates a cross-sectional view of a packaged semiconductor device including a complex semiconductor chip, which comprises a sophisticated metallization system that is directly connected to a package substrate, thereby resulting in a significant thermally induced deformation of the package substrate, according to conventional direct package-die contact regimes.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides semiconductor chips, package substrates, packaged semiconductor devices and techniques for assembling packaged semiconductor devices, wherein thermally induced stress forces in a complex metallization system may be reduced during the critical assembling process by avoiding undue temperatures during the assembly process. To this end, at least metal-containing contact elements in the package substrate and the semiconductor chip may be connected with each other by using form closure, i.e., a mechanical contact in which complementary contact elements of the package substrate and the semiconductor chip engage with each other, thereby forming an interface without requiring any intermediate materials at the interface, which may have to be treated at elevated temperatures, i.e., at temperatures that are above a predefined maximum acceptable temperature, such as 150° C. In some illustrative embodiments disclosed herein, the process temperature during the mechanical assembly of the package substrate and the semiconductor chip is selected to be at or below the rated usage temperature of the semiconductor chip so that any thermally induced stress forces, in particular in a complex metallization system, are less compared to any thermally induced mechanical stress forces that are created during the normal operation of the packaged semiconductor device. For this purpose, the contact structure of the package substrate and the contact structure of the semiconductor chip may be provided on the basis of any appropriate metal-containing material, or generally conductive material, wherein the configuration of each pair of complementary contact elements may enable a direct contact between at least some surface portions so as to establish a mechanical connection and also provide the required electrical and thermal conductivity. Consequently, the connection between contact elements of the package substrate and contact elements of the semiconductor chip may be established via an interface in which the presence of any solder material is no longer required. In this context, a solder material is to be understood as any conductive material composition having a melting temperature of above approximately 180° C. Consequently, by applying the "solder-free" contact regime as disclosed herein, any appropriate metal materials may be used, for instance, the same or different materials may be used in the package substrate and the semiconductor chip in compliance with appropriate manufacturing techniques or the corresponding metallization systems of the package and the semiconductor chip. Moreover, the handling of any solder materials during the process of forming complex metallization systems may no longer be required, thereby saving resources and process tools, while also achieving increased throughput. That is, certain processes, such as the reflow process for forming solder balls and the like, may be omitted. Consequently, the socket and plug-like connection technique and the corresponding complementary contact structures of a semiconductor chip and a package substrate may be applied to any type of semiconductor devices, such as devices that may usually be connected by wire bond techniques, by lead-containing solder materials, by lead-free solder materials and the like, since appropriate contact structures may be formed on the basis of any desired metal material without unduly increasing overall process complexity.

Figure 1B:
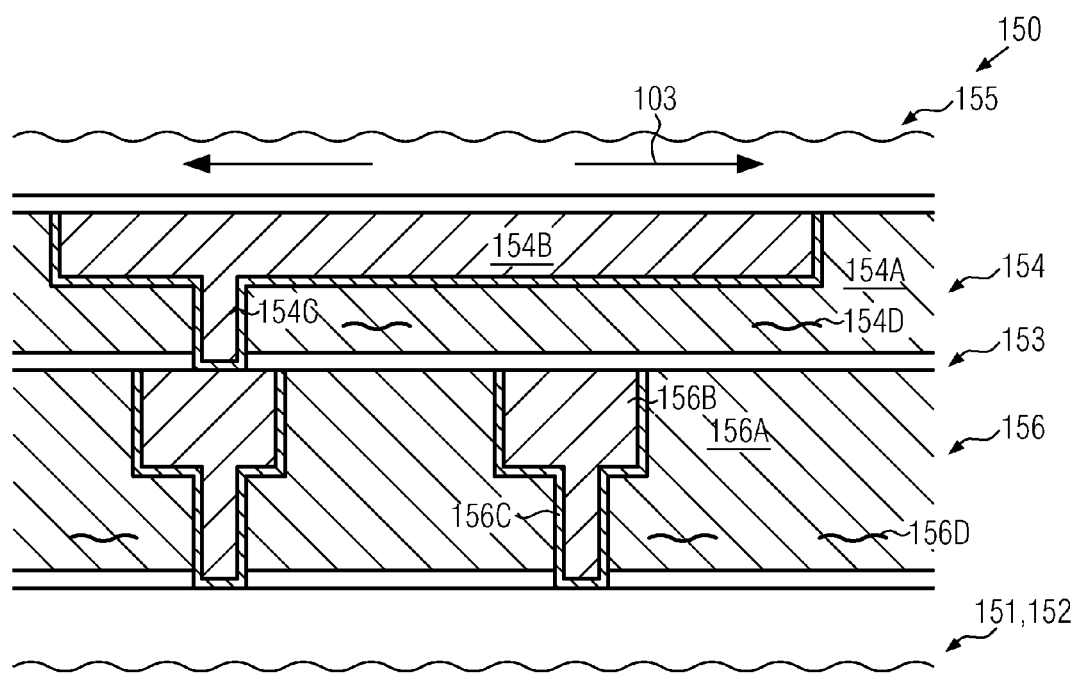
FIG. 1b schematically illustrates a portion of the complex metallization system of the semiconductor chip of FIG. 1a, wherein a plurality of defects are generated, in particular during the critical assembly process for connecting the semiconductor chip and the package substrate on the basis of a soldering process, due to the moderately high melting temperature of solder materials, in particular of lead-free solder materials.

With reference to FIGS. 2a-2k, further illustrative embodiments of the "self-locking" assembly technique of the present disclosure will now be described in more detail, wherein reference may also be made to FIGS. 1a-1b, if appropriate.

Figure 2A:
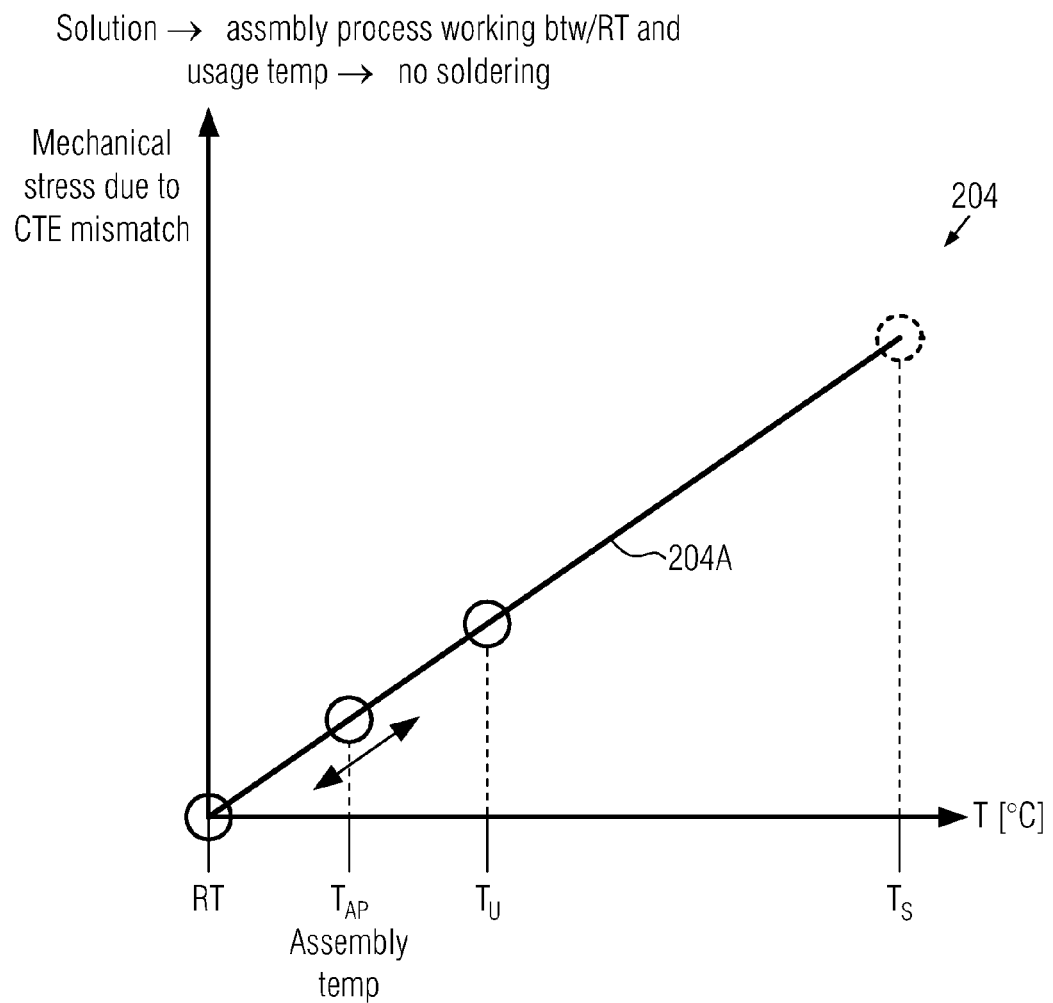
FIG. 2a schematically illustrates a graphical representation of the thermal conditions during a direct package/chip assembly in comparison with conventional thermal conditions, according to illustrative embodiments.

FIG. 2a schematically illustrates the thermal situation in conventional solder-based assembly processes in comparison with the thermal situation when using the self-locking assembly mechanism and the correspondingly adapted contact structures according to the principles disclosed herein. As illustrated, the graph of FIG. 2a qualitatively depicts the thermally induced mechanical stress, for instance in at least some of the metallization layers of a metallization system of a semiconductor chip, versus the temperature. In the graph of FIG. 2a, a generally linear dependency is illustrated in which the magnitude of mechanical stress caused by a mismatch of the coefficient of thermal expansion between the package substrate and the semiconductor chip is plotted against the temperature, as indicated by curve 204A. It should be appreciated, however, that generally the mechanical stress caused by the thermal mismatch may have any other shape wherein, however, at any rate, the thermally induced mechanical stresses and thus the resulting damage may significantly increase with the temperature that is applied during the assembly process. As illustrated, in conventional solder-based assembly concepts, a temperature, indicated as $T_S$, has at least to be applied so as to melt the solder material, wherein the temperature may be well above the melting point of the solder material, which, in particular in lead-free applications, may require temperatures of 300° C. and even higher. As discussed above, the resulting mechanical stresses, in particular upon cooling down the composite device, may significantly stress the device, as discussed above. In the present disclosure, a very different approach is applied in which the maximum process temperature during the assembly process may be significantly reduced, i.e., at least below the melting temperature of typical solder materials as are currently used in semiconductor production techniques. For example, process temperatures of approximately 150° C. and less may be efficiently applied. In some illustrative embodiments, as indicated in FIG. 2a, a process temperature $T_{AP}$ used during the assembly process may be selected to be below a typical temperature of operating or using the semiconductor device under consideration, as indicated by the temperature $T_U$. In this case, the temperature $T_U$ is to be understood as a typical temperature of the environment of a packaged semiconductor device, such as a heat sink and the like. For example the temperature $T_U$ may be selected to be approximately 100° C. and less. In some illustrative embodiments, as illustrated in FIG. 2a, the assembly temperature $T_{AP}$ may be positioned in a center area of a temperature interval defined by the usage temperature $T_U$ and a typical handling or storage temperature, such as room temperature, indicated by RT. In this case, the resulting mechanical stress forces may not unduly damage even sensitive metallization systems, since typically these systems are appropriately configured so as to be operated according to the usage temperature $T_U$ when beginning the operation of the device starting from the temperature RT.

Consequently, the thermally induced mechanical stress forces experienced during the assembly process may be well within the range of the mechanical stress forces resulting from handling and operating the corresponding packaged semiconductor device.

Figure 2B:
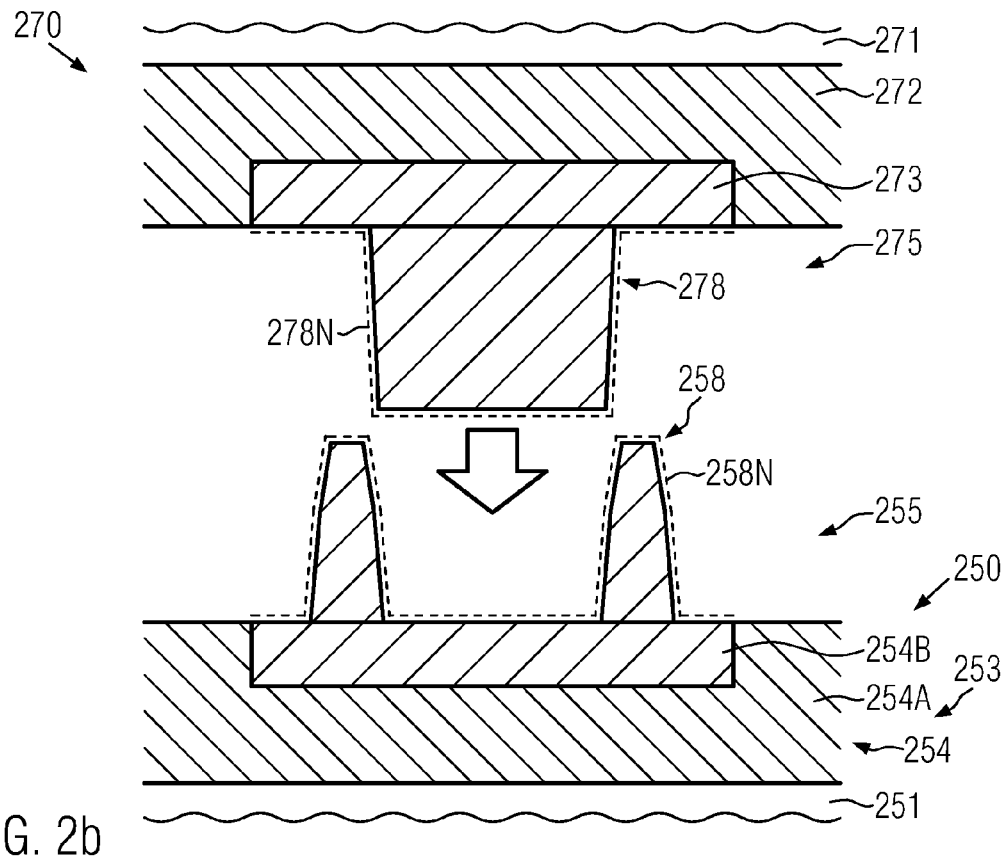
FIG. 2b schematically illustrates a cross-sectional view of a package substrate and a semiconductor chip including a corresponding contact structure for a direct mechanical connection by form closure, for instance using a socket-plug-like configuration, according to illustrative embodiments.

FIG. 2b schematically illustrates a cross-sectional view of a package substrate 270 and a semiconductor die or chip 250, which are appropriately configured so as to be connected by a mechanical contact in order to provide a "self-locking" behavior. To this end, the package substrate 270 may comprise a contact structure 275, while the semiconductor chip 250 may comprise a contact structure 255, which may be considered as complementary contact structures in the sense that these structures may be connected on the basis of form closure so that at least portions of the structures 275 and 255 may engage with each other. As illustrated, the package substrate 270 may comprise any appropriate carrier material 271, such as organic materials, as discussed above, which typically may have a different coefficient of thermal expansion compared to typically used semiconductor materials, such as silicon and the like. Moreover, the material 271 may have formed therein any appropriate "metallization" system (not shown) in order to provide the electrical connections, which may finally connect to metal regions or metal pads 273 that are formed in an appropriate dielectric material 272. Furthermore, a contact element 278 may be formed on the metal region 273 and may represent a contact element that may engage with a contact element 258 of the contact structure 255. In this context, the term "engage with" is to be understood that the contact elements 278 and 258 may be mechanically connected so as to form an interface at least at sidewall areas thereof, as will be explained later on in more detail. For example, the contact elements 278, 258 may connect to each other by form closure, which may be understood as a form of direct mechanical contact of at least some surface areas of these elements, wherein the resulting sticking friction may lead to a desired electrical and thermal contact between the elements 258 and 278. Moreover, as will be explained later on in more detail, the form closure, i.e., the engaging of the contact elements 278, 258 may also result in a pronounced mechanical adhesion of the contact structures 275, 255 in order to reliably attach the package substrate 270 to the semiconductor chip 250. As will be described later on, additional "contact elements" may be provided, for instance in the form of dielectric contact elements and the like, in order to enhance the engagement of the structures 275 and 255.

As shown, the contact element 258 may be formed on a metal region 254B of a metallization layer 254, which may thus represent the very last metallization layer of a metallization system 253. As discussed above, the metallization system 253 may comprise a plurality of metallization layers, such as the layers 154, 156 of the device 100, which may include low-k dielectric materials, ULK materials and the like. In other cases, the metallization system 253 may represent a "conventional" metallization system, for instance formed on the basis of silicon dioxide, silicon nitride and the like, wherein, in this case, also the solder-free assembly technique as disclosed herein may be applied in order to achieve superior overall process efficiency. The metallization layer 254 may thus comprise a plurality of metal regions or metal pads, wherein, for convenience, a single pad 254B is illustrated in FIG. 2b, which may be embedded in any appropriate dielectric material 254A.

The contact elements 258, 278 may be provided with any appropriate shape that allows a mechanical contact in the form of a plug and socket connection, wherein, in the embodiment shown, the contact element 278 may have a substantially "pillar-like" configuration, while the contact element 258 may have a configuration so as to receive at least a portion of the contact element 278. It should be appreciated, however, that respective complementary pairs of contact elements, such as the elements 258, 278, may be provided in any appropriate configuration, wherein the size and shape may vary within the contact structure 275 and the contact structure 255, depending on the overall device requirements. For example, generally, the lateral size and thus the surface area for connecting the elements 278, 258 may vary, depending on the thermal and/or electrical requirements of specific circuit portions of the device 250, while, in other cases, substantially identical contact elements may be used, wherein superior current drive capability or thermal conductivity may be achieved by providing a plurality of contact elements connecting to the same metal region. Similarly, any appropriate conductive material may be used for the contact elements 278, 258, which may not necessarily be the same type of material for the element 278 and the element 258. For example, in sophisticated metallization systems, copper is frequently used as a basic highly conductive material and, thus, the very last metallization layer 254, as well as any lower-lying metallization layers, may be formed on the basis of copper. In this case, the contact element 258 may also be formed of copper, thereby efficiently using well-established process techniques, resources and process tools. In other cases, the contact element 258 may be formed on the basis of any appropriate conductive material, such as aluminum, copper alloys, silver, gold, nickel and the like, or any combinations of these materials, depending on the overall device requirements. For example, a desired base material, such as copper, aluminum and the like, may be used for forming the contact element 258, while an additional surface coating may be applied, for instance in the form of a non-corroding material, such as gold, thereby providing superior contact resistivity.

Similarly, the contact element 278 may be formed on the basis of any appropriate material, which may even be different from the material used for forming the contact element 258. For example, depending on the overall process strategy for forming the package substrate 270, a corresponding metal or metal system may be used for forming the contact element 278, as long as a complementary shape is provided so as to mechanically engage with the contact element 258.

The semiconductor chip 250 may be formed on the basis of any appropriate process technique for providing circuit elements in and above a substrate 251, followed by any appropriate process techniques for forming the metallization system 253, as is, for instance, also described above with reference to the semiconductor device 100. Thereafter, the final metallization layer 254 may be formed so as to provide the metal region 254B, followed by any appropriate process technique for forming the contact structure 255. For example, a mask layer (not shown), for instance in the form of a resist material and the like, may be provided and may comprise corresponding openings, which may be subsequently filled with one or more appropriate conductive materials, such as aluminum, copper, silver and the like, possibly in combination with additional barrier materials, as considered appropriate. Thus, after the removal of a corresponding mask material, the contact elements 258 may be provided as shown in FIG. 2b. It should be appreciated that, if required, the contact structure 255 may comprise any appropriate dielectric material, such as a polyimide material and the like, as is frequently used as a passivation material above a metallization system of a semiconductor device. In other cases, the contact element 258 may be formed on the basis of other deposition techniques, such as chemical vapor deposition (CVD) and the like, and applying a patterning process on the basis of an appropriate etch mask, such as a resist mask and the like.

Similarly, the package substrate 270 may be formed by any well-established process techniques, wherein the contact element 278 may be provided, for instance, by electroplating techniques, electroless plating and the like, using an appropriate mask for obtaining the complementary shape with respect to the contact elements 258, thereby ensuring proper alignment and contact of these elements, as will be described later on in more detail. As discussed above, the contact elements 258, 278 may be provided with substantially the same material composition or may have a different material composition. Furthermore, as shown, one or both of the contact elements 258, 278 may receive a surface coating 258N, 278N, respectively, for instance in order to avoid corrosion and/or improve thermal and electrical conductivity between the contact structures 275 and 255 after attaching the package substrate 270 to the semiconductor chip 250. For example, the surface coating 258N, 278N may be provided in the form of a gold material or any other material which may provide non-corroding behavior and which may increase overall conductivity. The layers 278N, 258N, if provided, may be applied on the basis of electroless plating techniques and the like.

Figure 2C:
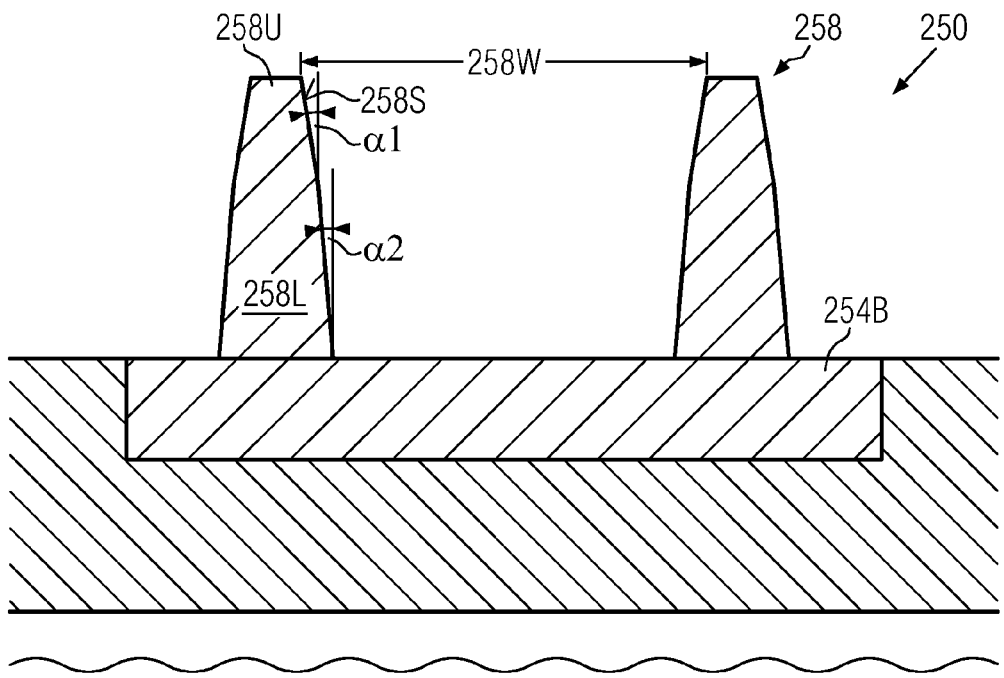
FIG. 2c schematically illustrates a cross-sectional view of a contact element provided on a semiconductor chip and/or a package substrate so as to provide superior alignment precision and mechanical adhesion, according to illustrative embodiments.

FIG. 2c schematically illustrates a cross-sectional view of the semiconductor chip 250 according to illustrative embodiments in which the contact element 258 may have a superior cross-sectional shape so as to provide superior alignment efficiency and also ensure reliable mechanical adhesion due to a self-locking mechanism caused by increased sticking friction. As illustrated, the contact element 258 may comprise an upper portion 258U, which may have a sidewall surface 258S that forms a moderately large angle with a surface normal so that generally a width 258W at the top of the upper portion 258U may be somewhat larger compared to the corresponding lateral size of the complementary contact element of the package substrate. Thus, the sidewall inclination $\alpha 1$, which may be in the range of approximately 10-30 degrees, may provide a self-centering behavior upon contacting the chip 250 with the complementary package substrate. Furthermore, the contact element 258 may comprise a lower portion 258L having a sidewall 258S with a reduced sidewall inclination, as indicated by an angle $\alpha 2$. The sidewall angle $\alpha 2$ may be selected so as to ensure that the sticking friction of the contact materials may result in a self-locking mechanism. To this end, the sidewall angle $\alpha 2$ may be selected such that the tangent of $\alpha 2$ is less than the coefficient of the sticking friction of the contact materials. Thus, based on material provided at the surface of the contact element 258 and the complementary contact element in the package substrate, an appropriate value of the angle $\alpha 2$ may be selected in order to obtain a reliable mechanical adhesion. To this end, the process for forming the contact element 258 may be appropriately designed so as to obtain the sidewall inclinations $\alpha 1$ and $\alpha 2$ in accordance with the requirements as specified above. An appropriate manufacturing strategy will be described later on in more detail.

It should be appreciated that the contact element as shown in FIG. 2c may be provided in the package substrate, as is also discussed above, depending on the overall concept of the contact structures.

Figure 2D:
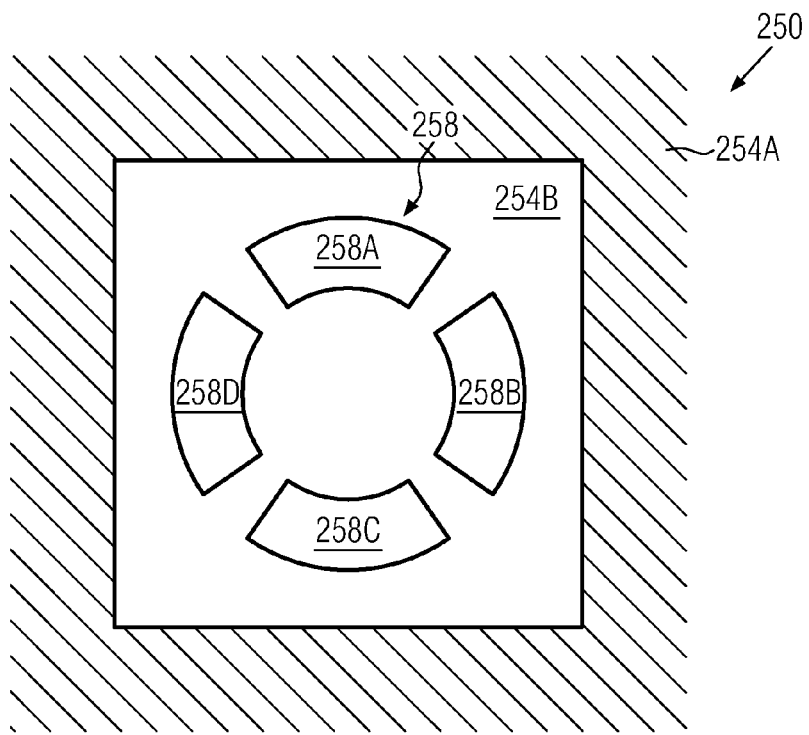
FIG. 2d schematically illustrates a top view of a contact element comprising a plurality of contact segments, according to illustrative embodiments.

FIG. 2d schematically illustrates a top view of the semiconductor chip 250. As illustrated, in some illustrative embodiments, the contact element 258 may comprise a plurality of contact segments 258A, 258B, 258C, 258D, which may be laterally separated from each other in order to provide increased flexibility or resilience of the contact element 258 upon receiving the complementary contact element of the package substrate. In the embodiment shown, the contact element 258 may have a substantially circle-like configuration in the top view shown, while, in other cases, any other appropriate geometric configuration may be used. For example, substantially square-like or generally rectangular configurations may be applied; in other cases, rectangular configurations in combination with circular or semi-circular configurations may be used, in order to obtain a large contact surface area and provide superior mechanical adhesion. For any of these geometric configurations, a plurality of segments may be provided, similarly as is shown for the ring-shaped configuration of FIG. 2*d*.

Figure 2E:
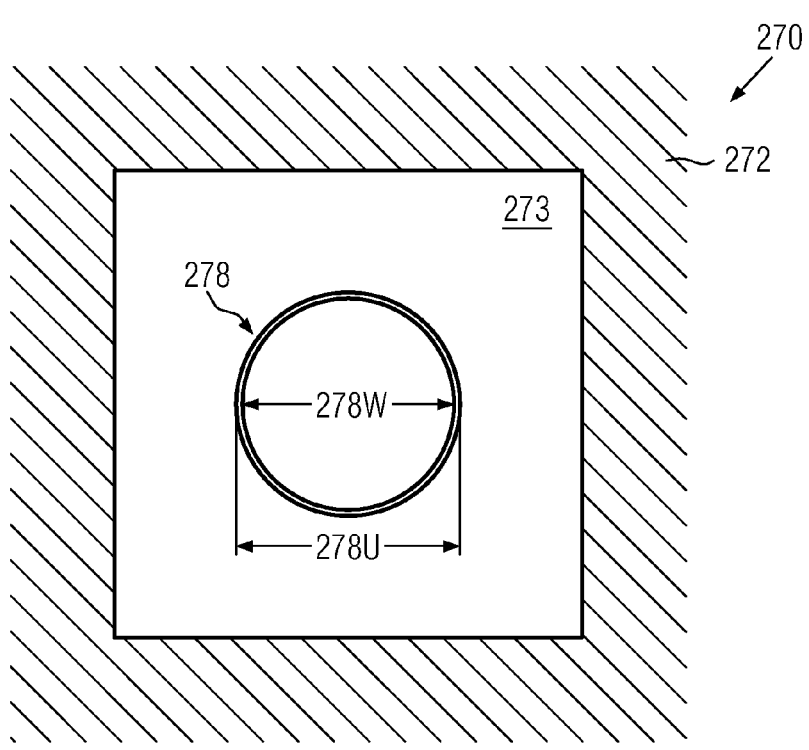
FIG. 2e schematically illustrates a top view of a pillar-like contact element, according to illustrative embodiments.

FIG. 2*e* schematically illustrates a top view of the package substrate 270 in which the contact element 278 may have a substantially ring or circular-shaped geometric configuration so as to comply with the general shape of the contact element 258 of FIG. 2*d*. The contact element 278 may have a pillar-like structure, which is to be understood in this application as any geometric configuration in which the lateral size is less than a height of the corresponding contact element. It should be appreciated, however, that any other appropriate geometric configuration may be selected as long as the required "complementary configuration" of the contact elements in the semiconductor chip and the package substrate are ensured. Furthermore, in the embodiment shown, a lateral width 278W of the contact element 278 at a top area thereof may be less than the lateral width 258W of the contact element 258 as shown in FIG. 2*c*, thereby allowing a reliable alignment of these contact elements, even if a certain degree of misalignment may occur during the fabrication of the contact elements 258, 278 and/or upon aligning the package substrate 270 with respect to the semiconductor chip. On the other hand, a lateral width 278U at the bottom of the contact element 278 may be appropriately selected so as to obtain the desired form closure and thus mechanical contact with the complementary contact element in the semiconductor chip, as explained above.

It should be appreciated that the contact element 278 as shown in FIG. 2*e* may also be implemented in the semiconductor chip, while the corresponding complementary contact element may be provided in the package substrate 270, if considered appropriate.

FIG. 2*f* schematically illustrates a cross-sectional view of the package substrate 270 and the semiconductor chip 250 during an initial phase of an assembly process for forming a packaged semiconductor device 200. As illustrated, the package substrate 270 may be appropriately aligned with respect to the semiconductor chip 250, which may be accomplished on the basis of any well-established process techniques as are also typically used in assembly processes performed on the basis of a solder material. Consequently, the contact elements 278 in the contact structure 275 may be positioned opposite to the contact elements 258 and a mechanical contact may be established by imparting a mechanical force to the substrate 270 and the semiconductor chip 250. It should be appreciated that the corresponding mechanical force may be applied in the form of a pressure, i.e., as force per unit area, thereby obtaining a very uniform mechanical stress across the entire device 200. That is, the resulting mechanical forces may be substantially identical in central areas and edge areas of the device 200, contrary to conventional assembly strategies in which typically, upon cooling the reflowed solder material, significant shear forces may be caused at the periphery of the composite semiconductor device. Furthermore, the mechanical force may be applied in a substantially perpendicular direction, thereby avoiding global shear forces upon attaching the substrate 270 to the semiconductor chip 250. More-over, as previously discussed, the shape of the contact elements 258 may provide a certain degree of self-centering effect upon connecting the substrate 270, wherein a certain degree of resilience, for instance by providing a plurality of contact segments for the element 258, as discussed above, may additionally reduce any resulting mechanical stress forces, even if a certain degree of misalignment may occur. Furthermore, during the assembly process, generally indicated as 206, any appropriate temperature may be selected, as is also discussed above, for instance with reference to FIG. 2*a*. Hence, any thermally induced mechanical stresses may be significantly less compared to the mechanical stress forces that may be caused during operation of the packaged semiconductor device 200.

FIG. 2*g* schematically illustrates the packaged semiconductor 200 in a state in which the contact elements 278 are engaged with the contact elements 258, thereby forming an interface 278S, which may be formed by the surface materials of the contact elements 278, 258. Due to the appropriate complementary shape of the contact elements 278 and 258, the interface 278S may be formed by form closure, wherein the sticking friction may provide reliable mechanical contact, while at the same time the increased interface 278S may result in superior thermal and electrical conductivity, for instance compared to solder-based strategies, wire-bonding techniques and the like. After mechanically connecting the package substrate 270 with the semiconductor chip 250, further processes may be performed, for instance providing any appropriate fill material in spaces between the contact structures 275 and 255, thereby even further enhancing the overall mechanical strength between the contact structures 275, 255.

Figure 2H:
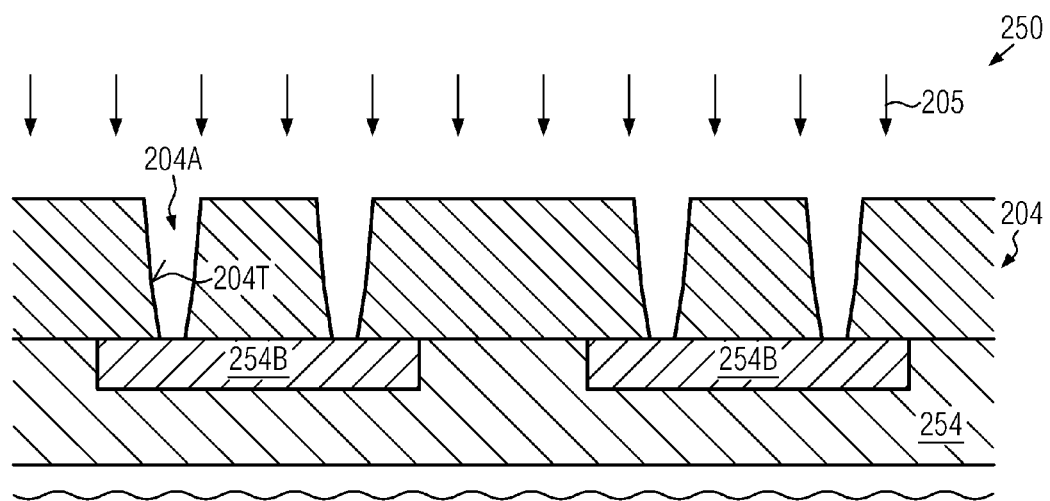
FIGS. 2h and 2i schematically illustrate cross-sectional views of a semiconductor chip or a package substrate upon forming contact elements having superior cross-sectional shape in order to enhance alignment accuracy and mechanical adhesion, according to illustrative embodiments.
Figure 2I:
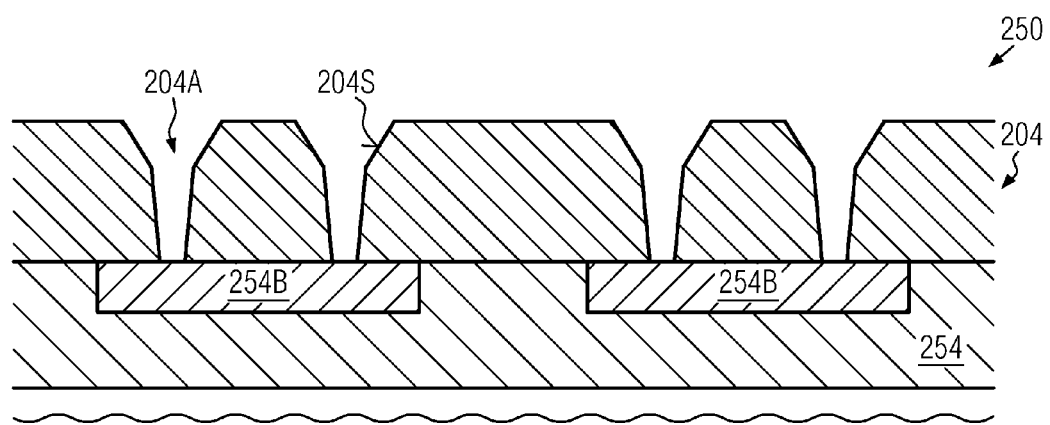

With reference to FIGS. 2*h* and 2*i*, further illustrative embodiments will now be described in which a desired sidewall inclination may be provided in contact elements, for instance as previously described with reference to FIG. 2*c*, in which two different sidewall inclinations may provide superior alignment efficiency and increased mechanical adhesion.

FIG. 2*h* schematically illustrates a cross-sectional view of the semiconductor chip 250 and/or of the package substrate 270, depending on the device configuration. For convenience, the corresponding manufacturing process for forming appropriately adjusted sidewall inclinations may be described with reference to the semiconductor chip 250, wherein it should be appreciated that any of these concepts may also be applied to the package substrate 270. As illustrated, the device 250 may comprise a deposition mask 204, which may be comprised of any appropriate material, such as a resist material, a polymer material and the like. The deposition mask 204 comprises corresponding openings 204A, which may correspond to a contact element to be formed, for instance to a contact element as previously illustrated with reference to FIG. 2*c*. For example, the openings 204A may correspond to a plurality of laterally separated contact segments, as is also discussed above. In the embodiment shown, the deposition mask 204 may have the openings 204A with an appropriate sidewall inclination 204T, which may be appropriate for obtaining a desired high sticking friction and thus mechanical adhesion, as is also discussed above. To this end, the deposition mask 204 may be formed on the basis of well-established process techniques, for instance by applying an appropriate material and performing a lithography process in order to pattern a mask, which may be subsequently used for transferring the openings 204A into the deposition mask 204. To this end, any well-established etch recipes may be applied, wherein the degree of anisotropy may be efficiently adjusted by controlling corresponding etch parameters, such as the presence of polymer species and the like. Consequently, the degree of sidewall inclination may be adjusted by controlling the etch parameters, thereby obtaining the inclination 204T. In other illustrative embodiments, the mask 204 itself may be provided in the form of a radiation-sensitive material, which may thus be exposed to radiation and may be developed according to well-established concepts, wherein a subsequent etch process may be performed so as to obtain the required inclination 204T. Next, a further etch process 205 may be applied in order to selectively increase the sidewall inclination in an upper portion of the openings 204A in order to obtain a superior cross-sectional shape of the corresponding contact elements, for instance in view of enhancing alignment accuracy, as discussed above. To this end, the process 205 may be performed as a plasma assisted etch process, an ion sputtering process and the like, wherein process parameters may be selected so as to obtain a desired degree of material erosion in an upper portion of the openings 204A. To this end, experiments may be formed in order to obtain an appropriate set of parameter values.

FIG. 2*i* schematically illustrates the device 250 and/or the package substrate 270 with an increased sidewall inclination 204S in an upper portion of the openings 204A. Consequently, during the further processing, any appropriate conductive material or materials may be filled into the openings 204A, for instance on the basis of electroless plating, electroplating and the like, wherein the size and shape of the resulting contact elements is determined by the openings 204A. The further processing may then be continued by removing the deposition mask 204 by any appropriate processes, such as oxygen-based plasma processes and the like.

Figure 2J:
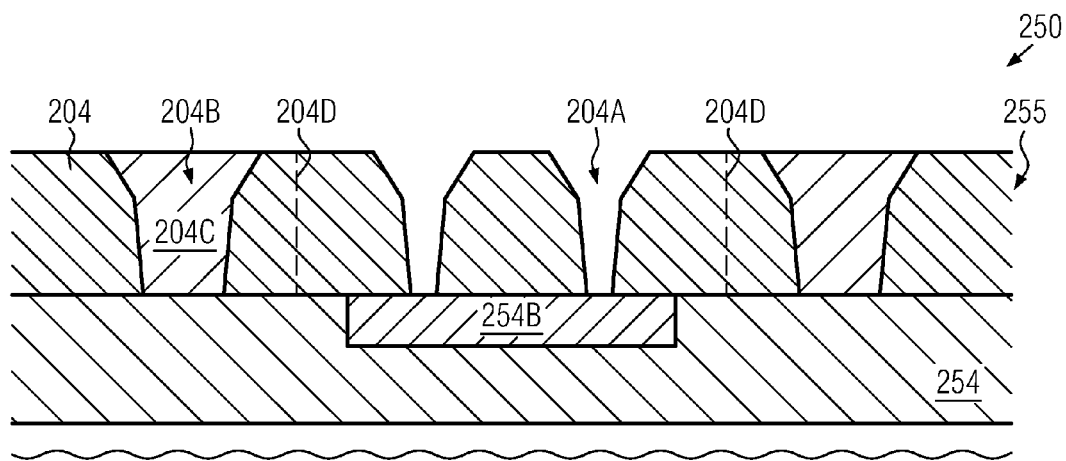
FIG. 2j schematically illustrates a cross-sectional view of a semiconductor chip or package substrate in which dielectric contact elements may be provided in the contact structure, according to further illustrative embodiments.

FIG. 2*j* schematically illustrates the device 250 and/or the substrate 270 according to further illustrative embodiments in which superior mechanical stability of the connection between the package substrate and the semiconductor chip may be accomplished by providing dielectric "contact elements." To this end, a dielectric material layer 204, which may also be used as a deposition mask, as discussed above with reference to FIGS. 2*h* and 2*i*, may be provided so as to comprise appropriate openings 204A for defining the size and position of contact elements to be formed on the metal region 254B by using an appropriate conductive material. Furthermore, the layer 204 may comprise openings 204B having any appropriate size and shape so as to connect to corresponding complementary dielectric contact elements, wherein the size and shape of the openings 204B may differ from the size and shape of the openings 204A. Preferably, the size and shape of the openings 204B is selected such that, for corresponding contact elements, a high sticking friction may also be obtained on the basis of similar sidewall inclinations as provided in the opening 204A. For example, the openings 204B may be provided in an area in which a reduced density of conductive contact elements may be encountered, wherein, however, the presence of any metal dummy contact elements may be considered inappropriate due to certain device-specific criteria. In other cases, the openings 204B may be provided adjacent to critical contact elements, which may require superior mechanical adhesion. The openings 204A, 204B may be formed on the basis of any well-established process strategies, as for instance discussed above with reference to FIGS. 2*h* and 2*i*, wherein, however, in some illustrative embodiments, a separate or an additional process may be performed so as to provide different inclinations, if required. To this end, a fill material 204C may be provided so as to fill the opening 204B having any appropriate sidewall inclination, while the openings 204A may still be exposed to a further treatment in order to adjust the required sidewall inclination. In other cases, a reverse order of these processes may be applied. Next, any appropriate deposition process, such as electroless deposition, may be applied so as to fill at least a portion of the opening 204A with a desired conductive material or materials. Thereafter, a portion of the layer 204 may be removed, as for instance indicated by the dashed line 204D, in order to provide the corresponding contact element as an "isolated" contact element. To this end, any appropriate lithography process may be applied. Thereafter, the fill material 204C may be removed selectively with respect to the remaining portion of the layer 204 and the contact element. In other cases, the fill material 204C may be removed prior to patterning the layer 204. It should be appreciated that a corresponding manufacturing sequence may also be applied in the complementary contact structure so as to provide a corresponding contact element having an appropriate size and shape for the opening 204B. Thus, upon connecting the contact structure 255 to the corresponding complementary contact structure, superior mechanical adhesion may be accomplished.

Figure 2K:
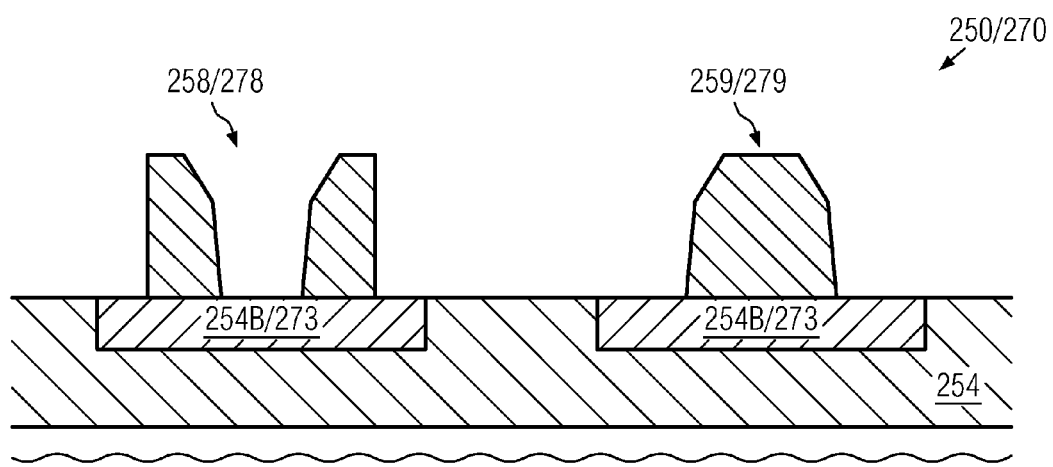
FIG. 2k schematically illustrates a cross-sectional view of a semiconductor device or a package substrate comprising two different types of contact elements for engaging with corresponding complementary contact elements, according to still further illustrative embodiments.

FIG. 2*k* schematically illustrates a cross-sectional view of the semiconductor chip 250 and/or of the package substrate 270 wherein different types of contact elements may be provided in the same contact structure. For example, in the embodiment shown, the contact element 258/278 may be provided in the general form of a "socket," which may receive a corresponding "plug" of the complementary contact structure. On the other hand, a contact element 259/279 may generally have a plug-like size and shape, thereby requiring a corresponding "socket" in the complementary contact structure. In this manner, any mechanical stress forces which may be caused, for instance, due to a certain degree of misalignment and the like, may be distributed among the semiconductor chip 250 and the package substrate 270 since, for instance, the "socket" 258/278 may provide a certain degree of resiliency, which may result in shear forces, while the "plug" 259/279 having a pillar-like structure may provide superior stiffness, which may result in a certain degree of deformation in the complementary contact structure. It should be appreciated, however, that the degree of shear forces that may be introduced into the corresponding substrate may be determined experimentally for each type of contact element and any appropriate size and shape may then be used so as to obtain, in total, a reduced magnitude of shear forces and thus damage in complex metallization systems.

As a result, the present disclosure provides manufacturing techniques, package substrates, semiconductor chips and packaged semiconductor devices in which a mechanical assembly regime may be applied without requiring the provision of any solder material. To this end, complementary contact structures may be provided so as to allow a connection on the basis of form closure. Consequently, any elevated temperatures during the assembly process may be avoided, thereby also significantly reducing the degree of mechanical stress forces created in the sensitive metallization systems. Since generally the processing of solder material in the semiconductor facility may be eliminated, the principles disclosed herein may be applied to any type of semiconductor devices, such as semiconductor devices processed on the basis of wire bond techniques, lead-containing solder materials and the like. On the other hand, the principles disclosed herein are highly advantageous in the context of complex metallization systems in which lead-free assembly regimes are required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a semiconductor chip comprising a metallization system comprising a chip contact structure, said chip contact structure comprising a chip contact element; and
   a package substrate comprising a package contact structure, said package contact structure comprising a package contact element, said chip contact element and said package contact element being mechanically engaged with each other and forming an interface, and wherein a sidewall surface of at least one of said chip contact element and said package contact element has a varying inclination.

2. The semiconductor device of claim 1, wherein said interface is a solder-free interface.

3. The semiconductor device of claim 1, wherein at least one of said chip contact element and said package contact element comprises a plurality of contact segments that are laterally separated.

4. The semiconductor device of claim 1, wherein sidewall surfaces of said chip contact element and said package contact element have complementary varying inclinations.

5. The semiconductor device of claim 4, wherein an angle of inclination in a upper portion of said at least one said chip contact element and said package contact element has a larger inclination angle than that of a lower portion of said at least one said chip contact element and said package contact element.

6. The semiconductor device of claim 1, wherein said package contact element has a pillar-like structure that is at least partially laterally enclosed by said chip contact element.

7. The semiconductor device of claim 1, wherein said chip contact element has a pillar-like structure that is at least partially laterally enclosed by said package contact element.

8. The semiconductor device of claim 6, further comprising a second chip contact element and a second package contact element engaged with each other, wherein said second chip contact element has a pillar-like structure.

9. The semiconductor device of claim 1, wherein at least one said chip contact element and said package contact element comprises a metal coating formed on a base material.

10. The semiconductor device of claim 1, further comprising a low-k dielectric material provided in said metallization system.

11. A semiconductor device, comprising:
    a package substrate comprising a package contact element;
    a semiconductor chip connected to said package substrate and comprising a chip contact element, said chip contact element being attached to said package contact element by form closure; and
    an alignment contact element formed in at least one of said package substrate and said semiconductor chip, wherein said alignment contact element comprises tapering sidewalls.

12. The semiconductor device of claim 11, wherein at least one of said chip contact element and said package contact element comprises a plurality of contact segments that are laterally separated.

13. The semiconductor device of claim 11, wherein an interface formed between said chip contact element and said package contact element by said form closure is a solder-free interface.

14. The semiconductor device of claim 11, further comprising alignment contact elements formed in said package substrate and said semiconductor chip, wherein said alignment contact elements comprise complementary tapering sidewalls.

15. The semiconductor device of claim 11, wherein inclination angles of the sidewalls of said alignment contact elements are larger in an upper portion of said alignment contact and smaller in a lower portion of said alignment contact.

16. The semiconductor device of claim 11, further comprising a non-corroding surface coating formed on at least one of said chip contact element and said package contact element.

17. A method of forming a packaged semiconductor device, the method comprising:
    forming a chip contact structure above a substrate of a semiconductor chip;
    forming a package contact structure above a package substrate, wherein forming said chip contact structure and said package contact structure comprises forming complementary conductive contact elements that are configured to be engaged with each other, an wherein sidewalls of said chip contact structure and said package contact structure have varying inclinations; and
    attaching said package substrate to said semiconductor chip by form closure of at least a portion of said chip contact structure and said package contact structure.

18. The method of claim 17, wherein forming said chip contact structure and said package contact structure comprises forming complementary conductive contact elements that have larger sidewall inclination angles in an upper portion of said alignment contact and smaller sidewall inclination angles in a lower portion.

19. The method of claim 17, wherein forming said chip contact structure and said package contact structure comprises forming complementary dielectric elements that are configured to be engaged with each other.

20. The method of claim 17, wherein attaching said package substrate to said semiconductor chip comprises adjusting a temperature of said semiconductor chip and said package substrate so as to be less than a rated operating temperature of said packaged semiconductor device.

21. The semiconductor device of claim 1, wherein a sidewall angle of at least one of said chip contact element and said package contact element is selected such that the tangent of the sidewall angle is less than the coefficient of sticking friction between said chip contact element and said package contact element.

22. The semiconductor device of claim 11, wherein a sidewall angle of said alignment contact element is selected such that the tangent of the sidewall angle is less than the coefficient of sticking friction of the contact materials.

23. The method of claim 17, wherein forming sidewalls of said chip contact structure and said package contact structure comprises forming sidewalls having a sidewall angle selected such that the tangent of the sidewall angle is less than the coefficient of sticking friction between said chip contact structure and said package contact structure.

* * * * *